United States Patent [19]

Stein

[11] 4,072,982
[45] Feb. 7, 1978

[54] SEMICONDUCTOR COMPONENT WITH DIELECTRIC CARRIER AND ITS MANUFACTURE

[75] Inventor: Karl-Ulrich Stein, Munich, Germany

[73] Assignee: Siemens Aktiengesellschaft, Berlin & Munich, Germany

[21] Appl. No.: 592,526

[22] Filed: July 2, 1975

[30] Foreign Application Priority Data

July 4, 1974  Germany ............................... 2432544

[51] Int. Cl.² ..................... H01L 27/12; H01L 23/14
[52] U.S. Cl. ......................................... 357/49; 357/41; 357/54; 357/55; 357/68; 357/69; 357/71; 357/72
[58] Field of Search ..................... 357/41, 49, 68, 72

[56] References Cited

U.S. PATENT DOCUMENTS

| | | | |
|---|---|---|---|
| 3,493,820 | 2/1970 | Rosvold | 357/49 |
| 3,602,982 | 9/1971 | Kooi | 357/49 |
| 3,617,816 | 11/1971 | Riseman | 357/68 |
| 3,710,205 | 1/1973 | Swanson | 357/49 |
| 3,801,880 | 4/1974 | Harada et al. | 357/68 |
| 3,868,724 | 2/1975 | Perrino | 357/68 |

Primary Examiner—William D. Larkins
Attorney, Agent, or Firm—Hill, Gross, Simpson, Van Santen, Steadman, Chiara & Simpson

[57] ABSTRACT

A semiconductor component of a semiconductor or circuit system is provided. The circuit incorporates a dielectric carrier comprised of synthetic material. The circuit is provided with plate-shaped semiconductor islands. The islands possess doping layers and are interconnected as desired with a thin film wiring. A process for the production of such product is also provided.

4 Claims, 4 Drawing Figures

SEMICONDUCTOR COMPONENT WITH DIELECTRIC CARRIER AND ITS MANUFACTURE

BACKGROUND OF THE INVENTION

Various known semiconductor components (including associated integrated circuits) possess a thin, monocrystalline silicon layer which layer is applied to an insulating substrate which serves as carrier. Various techniques are known to the art for the production of such semiconductor components. For example, in accordance with the so-called SOS technique, a monocrystalline silicon layer is applied by deposition to a substrate crystal, such as a spinel or a sapphire. For another example, the so-called "dielectric insulation technique" utilizes a dielectric carrier layer having a thickness of a few microns and consisting of, for instance, $SiO_2$, deposited on the surface of, for instance, a monocrystalline silicon wafer. The resulting silicon wafer is then thinned to a desired dimension, the thinning being effected by polishing, etching, or the like. A disadvantage of the first-mentioned technique is that the silicon layers produced by hetero-epitaxy contain more interference centers or crystal imperfections than the producible solid or bulk monocrystalline silicon. The properties of the boundary between the silicon layer and the insulating substrate, furthermore, give rise to various limitations. The "dielectric insulation" technique suffers from various disadvantages, particularly the relatively high outlay for the application of an insulating, dielectric carrier layer.

BRIEF SUMMARY OF THE INVENTION

The present invention is directed to an integrated circuit assembly incorporating semiconductor units, or a component subassembly of such a circuit, which incorporates a plurality of plate-like islands of semiconductor material, all supported upon a dielectric carrier, or wafer. The islands are provided with doping layers. Thin film deposits on selected areas of the dielectric carrier (and, perhaps, on the islands themselves), which deposits are electrically conductive, interconnect selected islands analogously to wiring to form a desired integrated circuit. The dielectric carrier is itself comprised of a synthetic layer.

In such a circuit, the islands and the conductive thin film deposits are preferably surrounded by a peripheral frame or wall which is comprised of a semiconductor material. The frame height exceeds the thickness of the islands and film deposits in the circuit. The frame is adapted to be supported by, or to bear, the dielectric carrier (together with the islands and film deposits thereon) along with conventional soldering terminals or the like which can extend outwardly from the dielectric carrier on the face thereof opposed to that supporting the frame.

The present invention is further directed to a process for the production of such a circuit. The process employs as a first operative step, the production of a desired such integrated circuit on a wafer of semiconductor material. Next, as a second operative step, a dielectric layer is applied over such integrated circuit, this layer's thickness being at least sufficient to permit such layer to function as a carrier body. Then, in a third operative step, such integrated circuit is subjected to thinning in regions where thinning is desired (or desirable) for the anticipated electric (or electronic) function of such circuit, such as switching.

An aim of this invention is to provide an integrated circuit assembly or subassembly which incorporates semiconductor units in which disadvantages of the SOS technique and/or of the dielectric insulation technique are circumvented.

Another object of this invention is to provide a system for fabricating integrating circuit elements incorporating semiconductor units wherein the outlay for production of such elements with an insulating dielectric layer may be reduced.

A feature of this invention is an integrated circuit assembly or subassembly incorporating a dielectric carrier comprising a layer of synthetic material.

Other and further aims, objects, features, purposes, and the like will be apparent to those skilled in the art from a reading of the present specification taken with the accompanying drawings.

DETAILED DESCRIPTION

Figure 1:
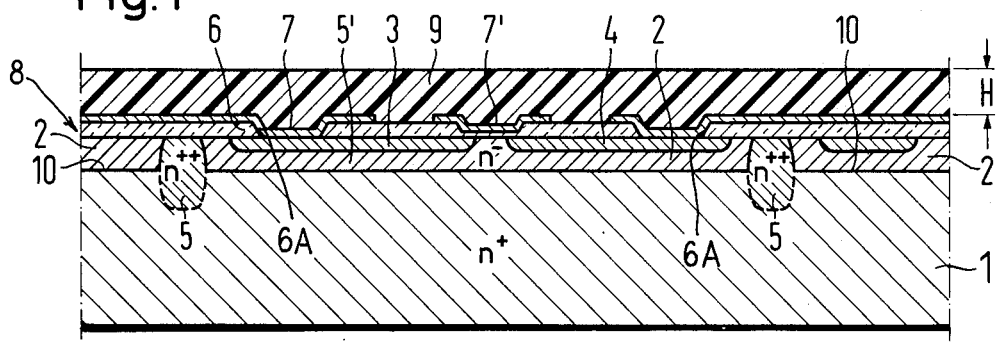
FIG. 1 is a fragmentary view in vertical sectional view showing in a diagrammatic manner an intermediate stage in the manufacture of one embodiment of the present invention which involves MOS transistors in an integrated circuit.

To practice the present invention, one can initially, in accordance with a known technique for the production of a semiconductor component, epitaxially deposit as an $n^-$ conducting monocrystalline layer on an $n^+$ conducting monocrystalline silicon base, such as a conventional silicon wafer. By the diffusion of p-conducting doping material into the resulting epitaxial layer, doped zones are provided which serve, for example, as source-and-sink or drain zones for MOS transistors. Such zones can themselves be interconnected together in some desired manner by means of applied metallic conductor layer paths to form, for example, an integrated MOS circuit. Thus, such an integrated circuit consists of the dielectric carrier or base which bears, usually on one face thereof, plate-shaped or plate-like islands. Such islands are provided with conventional doping layers, and conventional conductors which connect the islands to one another by what is, in effect, a thin film wiring to achieve a desired circuit.

As the semiconductor base, for example, one can employ a silicon wafer of customary thickness, such as a wafer of about 400 microns in thickness. The epitaxially applied $n^-$ conducting layer on the silicon wafer typically contains zones doped with alien or impurity atoms, such as boron, phosphorus, or the like.

Examples of integrated circuits which can thus be formed on such a semiconductor base include those having electronic crosspoints operating in accordance with the thyristor principle, MOS surface transistors, and the like.

Although in the present embodiment being described for illustrative purposes, a semiconductor wafer in the form of monocrystalline silicon is used, it is also possible to use other semiconductor materials, such as, for example, germanium, or Groups III-V (of the Periodic Table of the Elements), semiconductor compounds, such as Ga, As, or the like. If, for example, a semiconductor wafer is provided with an epitaxial layer containing such doped zones in the region of the electric circuit, the semiconductor wafer is, in the practice of this invention, thinned down to this layer at least, using conventional thinning techniques, in the practice of this invention. Such a thinning avoids parasitic currents flowing through zones outside the doped layer, especially over the semiconductor wafer, or it avoids capacitances arising in a product wafer which would or could impair the function of a product circuit.

Next, usually as a second step a dielectric synthetic layer is applied to the semiconductor circuit having thickness characteristics as above indicated. Typically, and for illustration purposes, such a layer can range from about 1 to 10 microns in average thickness, though thicker and thinner layers may be employed if desired, depending upon consideration of individual process and product applications involved and other factors.

A preferred material for such dielectric synthetic layer comprises a polyimide. Starting ingredients may be an anhydride, such as pyromellitic dianhydride, and an aromatic diamine with the basic polymer structural unit sometimes being given as

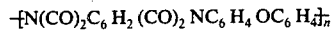

$$-[N(CO)_2 C_6 H_2 (CO)_2 N C_6 H_4 O C_6 H_4]_n-$$

The starting ingredients are preferably preliminarily reacted to form a polyamide acid. In the preferred practice of this invention, such a polyamide acid is first applied over a preformed integrated circuit as described above in a manner similar to that employed for applying a conventional photo lacquer layer. Conventional thermoset methods of fabrication can be used in converting the applied polyamide acid to the desired polyimide. For typical, commercially available polyamide acid materials, transformation temperatures for converting such polyamide acid into the desired polyimide form range from about 350° to 500° C. Examples of suitable commercially available starting resins include those available from the E. I. Du Pont de Nemours Co., Wilmington, Del. under the trade designations Type SP-1 and Type SP-2. Polyimide resins have a combination of electrical and mechanical properties, particularly compatibility with conventional semiconductor and integrated circuit components which make them well suited for use in the present invention.

In the preferred practice of the present invention, after the application of the polyimide layer, the rear of the semiconductor wafer (which is preferably a monocrystalline silicon wafer) is removed, for example, by conventional etching. Thus, oxide layers located on the semiconductor wafer surface, or low-doped silicon zones, such as, for example, the above described n-epitaxial layer, serve in known manner as etch-stop means for a suitable etching agent. However, the conductivity of the thus exposed second silicon boundary can produce a series of problems which, in view of the new very thin synthetic layer, can no longer be overcome by the previously conventionally employed thermal treatments of the semiconductor wafer at temperatures of around 500° C. Therefore, in the present invention, by means of ion implantation, and/or by the application of a synthetic layer suitable for the purpose, preferably comprised of polyimide resin as above indicated, this second boundary is passivated. If other synthetic organic polymeric resins are used, their affinity to silicon or the particular semiconductor materials involved should be checked. The thin silicon layer produced in this way by the etching of a monocrystalline silicon wafer possesses all the properties of conventional so-called "solid silicon". In addition, by etching away the silicon layer between adjacent components it is possible and practical to achieve a substantially ideal insulation between these semiconductor and integrated circuit components. Therefore, the technique of this invention is not only of significance for making integrated MOS circuits, but is also valuable in particular for making those bipolar, integrated circuits in which it was not previously possible to provide a very good electrical insulation, such as, for example, is associated with prior art production of an electronic crosspoint integrated in a semiconductor wafer and adapted to operate in accordance with the thyristor principle.

Referring more particularly to the drawings, an embodiment of, and the practice of, the present invention is illustrated: In FIG. 1, where a cross-section of an integrated semiconductor circuit 8 which utilizes MOS components is shown in one stage of its production, there is seen a silicon wafer 1 of the n+ type which supports an epitaxial layer 2 of the n- type. Layer 2 contains doped zones, for example source- and drain zones 3 and 4, and also separating or dividing diffusion zones 5. The zone distribution in the active portions of the silicon substrate wafer 1 is, of course, dependent on the relevant function of the particular semiconductor components involved, and thus is independent of the invention, as those skilled in the art will readily appreciate. Arranged on layer 2 is an insulating silicon dioxide layer 6 provided with contact holes such as 6A and 6A' therethrough. Also arranged on layer 2 thin film patterns consisting, for example, of aluminum conductor layer paths 7 and 7' which function as interconnecting wires. Any desired or convenient construction procedure can be used to fabricate such a circuit 8 upon such a wafer 1, as those skilled in the art will appreciate.

When the integrated semiconductor circuit 8 is in this production state, a polyamide layer 9 is applied in known manner over the surface of the integrated semiconductor circuit 8, subsequently, this layer 8 is transformed into the desired polyimide carrier layer 9 by heating at a temperature preferably ranging from about 400° to 500° C.

Figure 2:
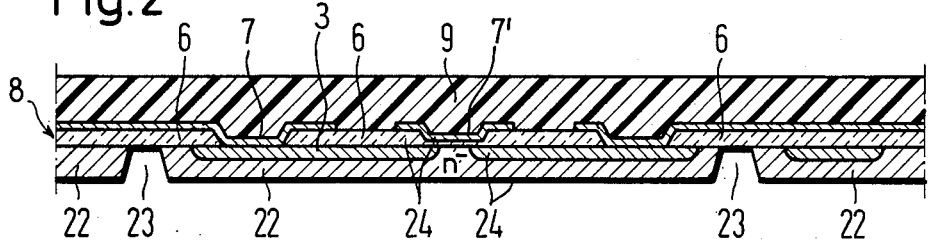
FIG. 2 is a vertical sectional view of the FIG. 1 embodiment, but showing such embodiment in a later stage of manufacture.

Next both the n+ and n++ doped zones of the silicon wafer are chemically etched away in known manner and, as can be seen by reference to FIG. 2, all that remains of the main body of the original silicon wafer 1 and the epitaxial layer 2 in etched regions is the active n- doped, monocrystalline, now plate-shaped silicon islands 22 (which are derived from the former epitaxial layer 2). These islands are generally the switching elements, for example, in this embodiment, MOS transistors 24. The insulating layers 6, the aluminum paths 7 and 7' and the carrier layer 9 also remain. The integrated semiconductor circuit 8 is thus designed in the P-channel MOS technique with an aluminum gate. As a result of the etching of the n+ silicon substrate wafer 1 and also of the separating zones 5 diffused in the wafer 1 and/or the layer 2, the islands 22 with laterally adjacent layer interruptions or separations 23 result so that a subsidiary current (which might otherwise form over the n+ portion of the substrate wafer 1) cannot occur.

Figure 3:
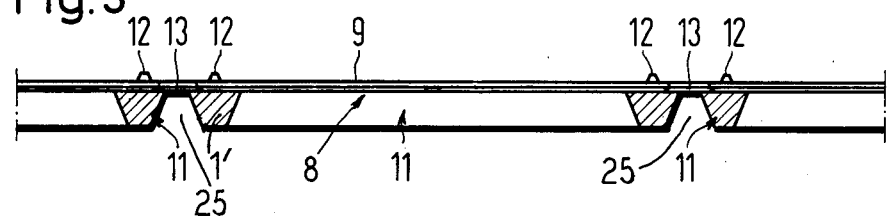
FIG. 3 is a vertical sectional view of the FIG. 1 embodiment, but showing such embodiment in a smaller scale and in a fully manufactured form.
Figure 4:
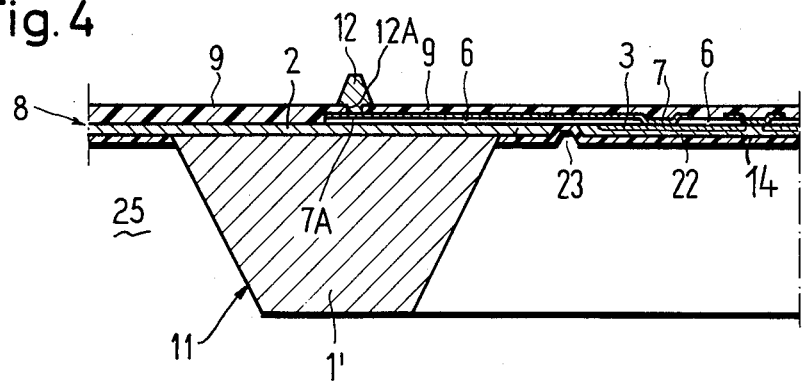
FIG. 4 is a greatly enlarged vertical sectional view of an edge portion of another embodiment which is similar in circuitry and basic construction to the embodiment shown in FIG. 3, constructional circuitry details being depicted.

As can be seen by reference to FIGS. 3 and 4, the thinning of the silicon wafer 1 down to the portions of active layer 2 comprising the doped zones or islands 22 is advantageously carried out in such manner that a wall 1' of the initial wafer 1 is left standing perimetrically about the peripheral edge portions of the integrated semiconductor circuit 8 (including islands 22). This form, as a whole, a frame 11 which serves as a support for the carrier layer 9 (and the circuit components secured thereto). Soldering terminals or bumps 12 are preferably located over a wall 1' upstanding from that side of layer 9 opposed to that on which circuit components (such as MOS transistors 24 and paths 7 and 7') are carried, a suitable hole 12A (see FIG. 4) being first formed through layer 9 by known procedure for each active terminal 12, so that a terminal 12 can make a desired electrical contact with some portion of circuit 8, as those skilled in the art will readily appreciate.

The conductor paths 7 and 7' are preferably located in such a manner that their terminal end contact portions 7A lie in the general region of the bases of walls 1'. Here such terminal contact portions 7A can be utilized for contact exposed for a conventional wire with the base of soldering bumps 12 through holes 12A. Alternatively, conventional wire contacting can be made directly with paths 7 and 7' through holes 12A if desired. As those skilld in the art will appreciate, in preferred embodiments, a plurality of such circuits 8 are arranged on a single wafer 1, each circuit 8 being separated from adjacent such circuits 8 by walls 1' which form a plurality of laterally adjacent frames 11 which are conveniently and preferably arranged in rows and columns, and which as produced are interconnected together by connecting portions 13 of a layer 9 and perhaps residual quantities of the thinned layer 1. A space 25 exists between laterally adjacent frame pairs 11. Thus, the components which are thus formed and which each bear an integrated semiconductor circuit 8 may be easily separated from one another in the form of chips.

A chip formed in this way can then be installed in a housing or in a printed or a wired circuit. The individual soldering bumps 12 of a given circuit 8 are preferably located and arranged to lie exactly over corresponding connection points in or on another adjacent wired or printed circuit for convenient soldering to the latter in known manner. The active zones exposed by etching, such as the islands 22, should, however, preferably be firstly passivated, in individual circuits 8 which can be effected either by an ion implantation process, the exact ion implantation used being dependent upon the nature of the doping of the active layer 2, and/or preferably by covering an individual circuit 8 with a layer 14, which is preferably comprised of polyimide, in accord with the teachings of this invention. Layer 14 can be formed similar to layer 9, as those skilled in the art will appreciate.

In summary, the present invention involves a component assembly which incorporates a flattened, integrated semiconductor circuit of the type having a plurality of discrete sites of doped, semiconductor material which discrete sites are interconnected together in a predetermined manner by layered paths of semiconductor material. By the present invention, a dielectric carrier layer generally continuously overlies and is integrally bonded to surface portions of such flattened integrated semiconductor circuit. On the side thereof opposed to that having such discrete sites, said carrier layer being comprised of a polyimide resin.

Preferably a component assembly of this invention having such a layer of polyimide resin additionally has a semiconductor wall member serving as supporting frame which generally continuously surrounds parametrically circumscribes such integrated semiconductor circuit. This wall member integrally bonds to the carrier layer of polyimide resin with a layer of semiconductor material having a conductivity type generally opposite to that of such wall member being interposed therebetween. The wall member upstands to a height in excess of the maximum thickness of such flattened integrated circuit. Preferably, such wall member upstands to a height which is in the range of from about 200 to 400 microns.

In one preferred embodiment of the present invention, a component assembly incorporates a second dielectric carrier layer generally continuously overlying, and integrally bonded to, surface portions of such flattened, integrated semiconductor circuit on the side thereof wherefrom such wall member so upstands. Such second dielectric carrier layer extends between such wall member laterally but the wall member upstands to a height in excess of the maximum thickness of such second dielectric carrier layer. Typically and preferably such second dielectric carrier layer has a thickness in the range of from about 1 to 5 microns.

Preferably, a component assembly of this invention further includes soldering terminals which are generally upstanding from the dielectric carrier layer, are deposited or positioned generally opposite to the semiconductor wall member, and are conductively connected with terminal end contact portions of such layered paths in the flattened integrated semiconductor circuit.

In another preferred form, the present invention relates to a plurality of such component assemblies which are in laterally adjacent relationship to one another and which are secured together substantially by a single such dielectric carrier layer.

In a preferred aspect, the present invention relates to a process for the production of such a component assembly which process involves the step of forming a semiconductor circuit as a first step. This formation process is preferably carried out by depositing an n− conductive monocrystalline epitaxial silicon layer on an n+ conducting silicon wafer. Thereafter, one diffuses p-conducting doping material into said epitaxial layer selectively to form doped zones. Next one deposits an insulative layer selectively thereover, and finally one deposits electrically conductive paths selectively thereover to complete preparation of the semiconductor circuit.

Next, one forms a layer of polyimide resin over the resulting said semiconductor surface, and, thereafter, one heats such layer of polyamide resin to convert same into a layer of polyimide resin.

Thereafter, one selectively etches away portions of such n+ silicon wafer and such n− epitaxial silicon layer to produce an embodiment of the invention.

Other and further embodiments and variations of the present invention will be readily apparent to those skilled in the art from the herein presented teachings without departing from the spirit and scope thereof.

In order to apply the polyamide layer 9, the wafer 1 is preferably placed on the spinplate of a centrifuge of the kind normally used for photoresist coating, covered with a few drops of the photo- or radiations-cross-linkable resin and centrifuged at preferably around 2000 revolutions per minute. The resin film formed in this way on the surface of the semiconductor component is about 2 to 10 µ thick.

Subsequently, the wafer 1 with the polyamide layer 9 on it is dried at about 100° C and subsequently exposed, preferably to ultraviolet light, through a negative original (Photomask). As a result, the exposed parts of the layer 9 cross-link under the effect of the light and cannot be dissolved by the developer. An alcoholic dimethylformamide solution is preferably used as the developer. By contrast, the unexposed parts of the layer are dissolved away by the developer. In this way, openings are formed at the required places, especially at the connecting spots for the contacts, for example as designated by the reference 12, 12A above the aluminium conductor track 7 in FIG. 4.

The layer 9 is then cured in another process stage. In this way, the layer is made very resistant. Appropriate curing conditions for specific irradiated pre-polymer coatings are well-known to persons versed in the art. For example, in the case of a polyamide, it is preferably cured for about 30 minutes at around 350° C.

I claim:

1. In a component assembly incorporating a flattened, integrated semiconductor circuit structure of the type having a plurality of discrete sites of doped, semiconductor material which discrete sites are interconnected together in a predetermined manner by thin layered paths of conductive material, the improvements which comprise:
   (A) a dielectric carrier layer generally continuously overlying, and integrally bonded to, surface portions of such flattened integrated semiconductor circuit structure on one side thereof, said carrier layer being comprised of a polyimide resin,
   (B) a semiconductor wall member generally continuously perimetrically circumscribing such integrated semiconductor circuit and integrally associated therewith on the opposed side of such flattened integrated semiconductor circuit structure,
   (C) such flattened integrated semiconductor circuit structure having said layered paths of conductive material therein located in adjacent relationship to said dielectric carrier layer on said one side thereof,
   (D) such flattened integrated semiconductor circuit structure further having said discrete sites of doped semiconductor material located in laterally spaced relationship to said wall member, and
   (E) said carrier layer having a thickness at least sufficient to provide mechanical support for said circuit structure and said thin layered paths.

2. The component assembly of claim 1, wherein a second dielectric carrier layer generally continuously overlies, and is integrally bonded to, surface portions of such flattened integrated semiconductor circuit on said opposed side thereof said second dielectric carrier layer extending between said wall member laterally, said wall member upstanding to a height in excess of the maximum thickness of such second dielectric carrier layer.

3. The component assembly of claim 1, further including soldering terminals which (A) are generally upstanding from said dielectric carrier layer, and (B) are conductively connected with terminal end contact portions of such layered paths through said dielectric carrier layer.

4. A plurality of component assemblies of claim 1 in laterally adjacent relationship to one another which are secured together substantially by said dielectric carrier layer.

* * * * *